United States Patent
Yamamoto et al.

(10) Patent No.: US 10,069,461 B2
(45) Date of Patent: Sep. 4, 2018

(54) DOHERTY AMPLIFIER

(71) Applicant: Kabushiki Kaisha Toshiba, Minato-ku (JP)

(72) Inventors: Takashi Yamamoto, Yokohama (JP); Takaya Kitahara, Kamakura (JP); Keiichi Yamaguchi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/433,174

(22) Filed: Feb. 15, 2017

(65) Prior Publication Data

US 2017/0163220 A1 Jun. 8, 2017

Related U.S. Application Data

(63) Continuation of application No. PCT/JP2014/083534, filed on Dec. 18, 2014.

(51) Int. Cl.
*H03F 1/02* (2006.01)
*H03F 1/56* (2006.01)
*H03F 3/68* (2006.01)

(52) U.S. Cl.
CPC ..... *H03F 1/0288* (2013.01); *H03F 2200/387* (2013.01)

(58) Field of Classification Search
USPC .................. 330/124 R, 295, 84, 286, 53–54
See application file for complete search history.

(56) References Cited

U.S. PATENT DOCUMENTS

| 6,262,629 B1 * | 7/2001 | Stengel ................. H03F 1/0261 330/124 R |
| 8,653,889 B1 | 2/2014 | Acimovic et al. |
| 9,209,511 B2 * | 12/2015 | Mei .......................... H01P 5/12 |
| 2005/0231286 A1 | 10/2005 | Gotou et al. |

FOREIGN PATENT DOCUMENTS

| EP | 2 698 918 A1 | 2/2014 |
| JP | 3-235402 | 10/1991 |
| JP | 2005-303771 | 10/2005 |
| JP | 2008-206106 | 9/2008 |
| JP | 2009-182635 | 8/2009 |
| JP | 2014-197755 | 10/2014 |

OTHER PUBLICATIONS

International Search Report dated Mar. 31, 2015 in PCT/JP2014/083534, filed on Dec. 18, 2014 ( with English Translation).
Written Opinion dated Mar. 31, 2015 in PCT/JP2014/083534, filed on Dec. 18, 2014.
David Yu-Ting Wu et al. "A 350 W, 790 to 960 MHz Wideband LDMOS Doherty Amplifier using a Modified Combining Scheme" Microwave Symposium (IMS), IEEE MTT-S International, 2014, 5 pages.

* cited by examiner

*Primary Examiner* — Hieu Nguyen
(74) *Attorney, Agent, or Firm* — Oblon, McClelland, Maier & Neustadt, L.L.P.

(57) ABSTRACT

According an embodiment, a Doherty amplifier includes a carrier amplifier, a peak amplifier, a first line and a second line. The carrier amplifier amplifies a signal and outputs a first output signal. The peak amplifier amplifies the signal and outputs a second output signal. The first line is connected to the carrier amplifier. The second line includes a first end connected to the peak amplifier and a second end connected to the first line. A characteristic impedance of the first end is lower than a characteristic impedance of the second end.

9 Claims, 10 Drawing Sheets

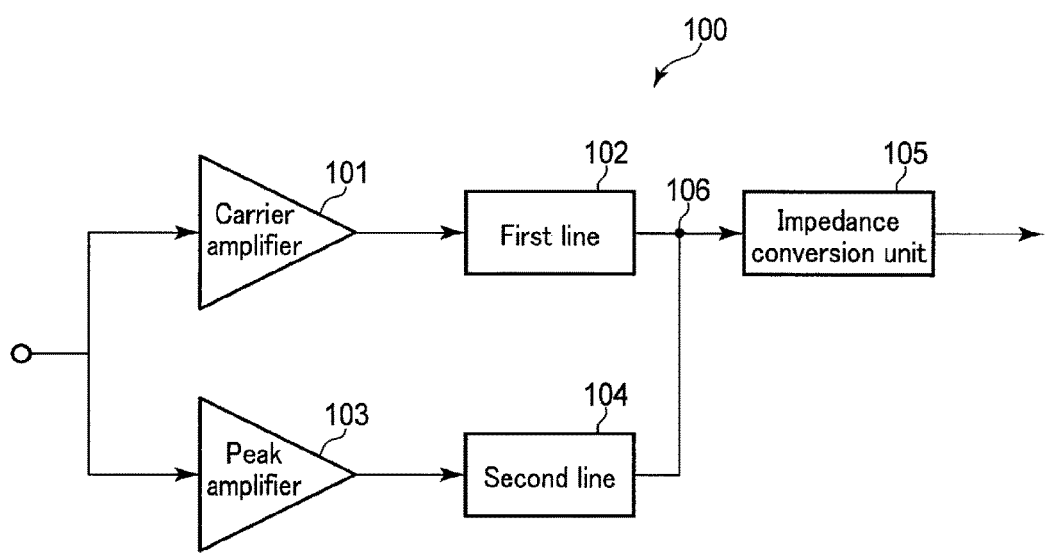
F I G. 1

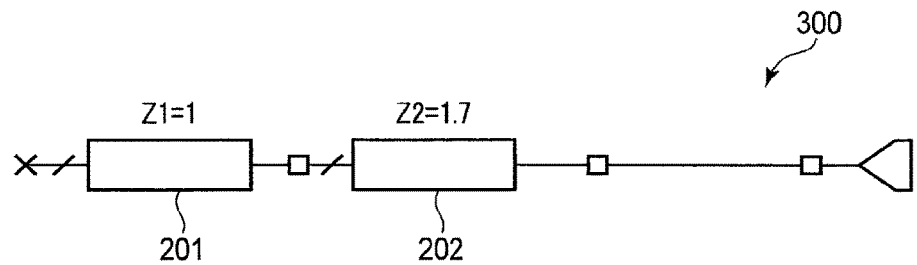
FIG. 3
| L1(φ) | L2(φ) | \|X_flow\|(Ω) | \|X_fhigh\|(Ω) | \|X\|min(Ω) |
|---|---|---|---|---|
| 30 | 150 | 9.8 | 3.15 | 3.15 |
| 60 | 120 | 10.6 | 4.68 | 4.68 |
| 90 | 90 | 8.53 | 8.11 | 8.11 |
| 120 | 60 | 6.22 | 9.74 | 6.22 |
| 150 | 30 | 4.49 | 4.42 | 4.42 |
FIG. 4
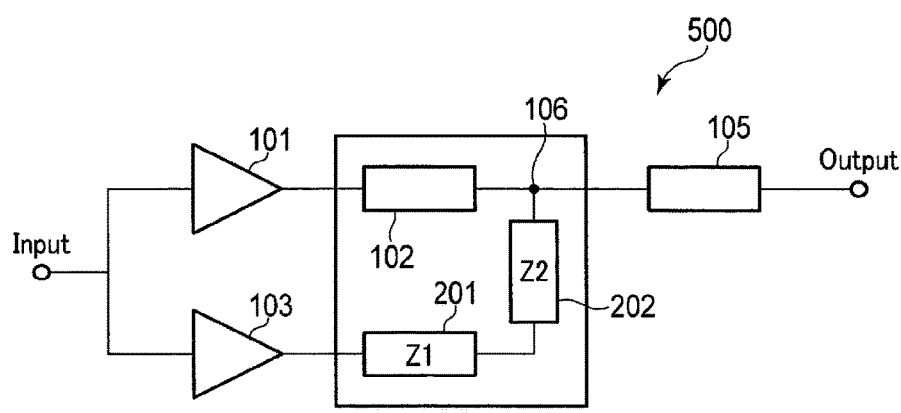
FIG. 5

| Z1 | Z2 | Assessment ||
| --- | --- | --- | --- |
| | | Efficiency > Desired value | Psat > Desired value |
| 1 | 1.2 | ○ | ○ |
| 1 | 1.4 | ○ | ○ |
| 1 | 1.7 | ○ | ○ |
| 1 | 2.2 | ○ | ○ |
| 1 | 3.2 | ○ | ○ |
| 1 | 4.1 | ○ | × |
| 1 | 5.7 | ○ | × |

F I G. 6

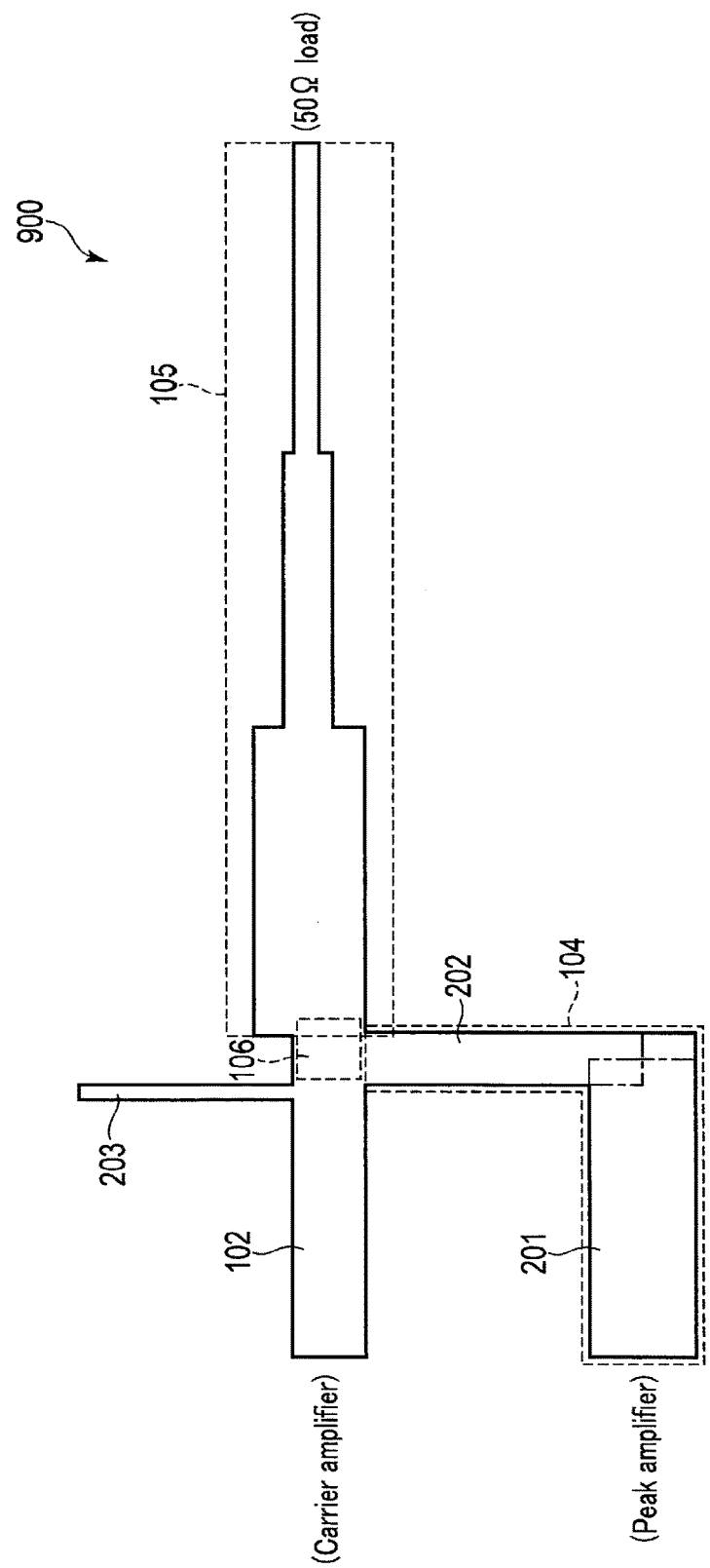
F I G. 9

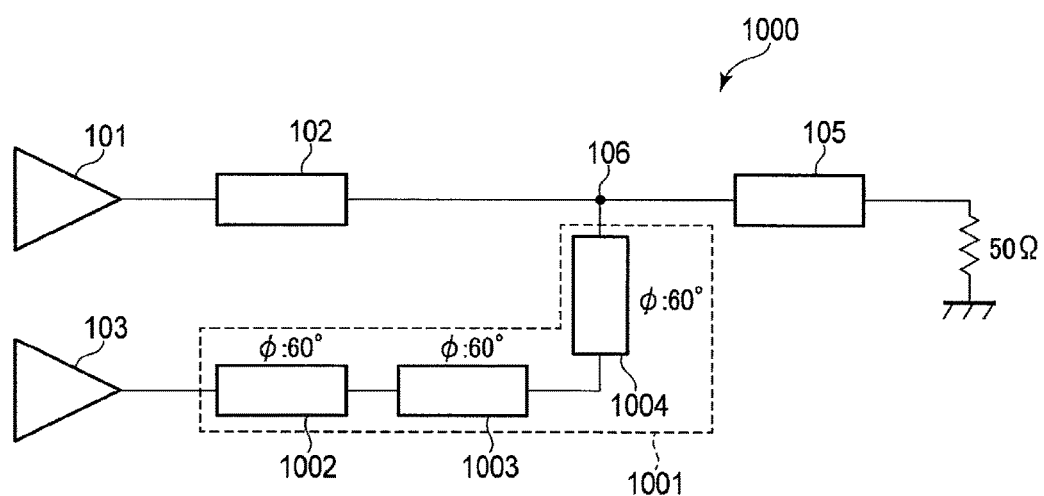
F I G. 10

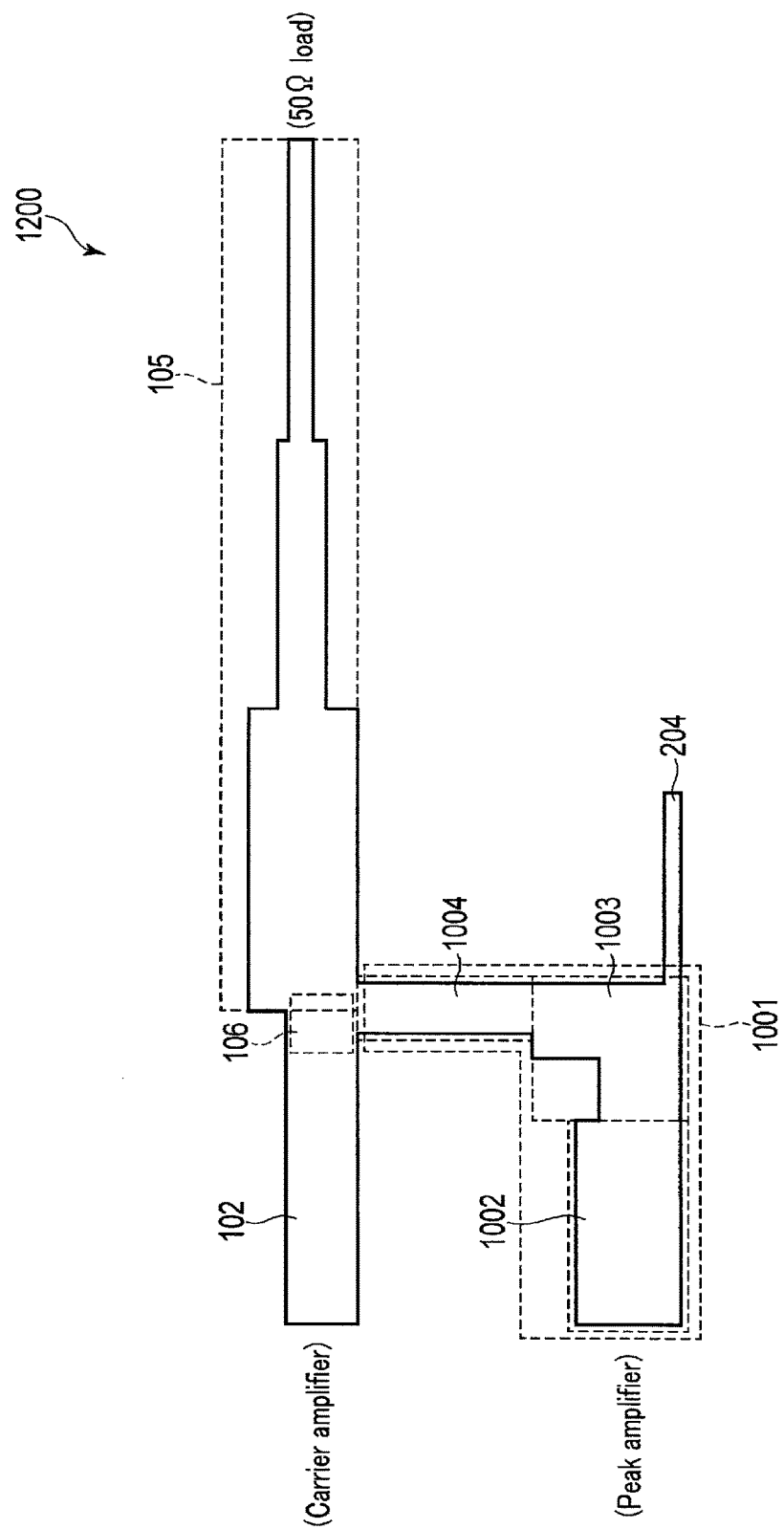
F I G. 12

DOHERTY AMPLIFIER

CROSS-REFERENCE TO RELATED APPLICATIONS

This application is a Continuation Application of PCT Application No. PCT/JP2014/083534, filed Dec. 18, 2014, the entire contents of which are incorporated herein by reference.

FIELD

Disclosures herein relate to Doherty amplifiers.

BACKGROUND

With the spread of wireless devices such as mobile phones, Doherty amplifiers have been increasingly adopted as one design of high-efficiency technology for high-frequency amplifiers. A Doherty amplifier comprises two amplifiers, namely, a carrier amplifier and a peak amplifier. A Doherty amplifier can adjust output levels by causing only a carrier amplifier to operate in regions of low output levels, and causing the carrier amplifier and a peak amplifier to operate when an output level approaches the saturation region of the carrier amplifier, thereby widely providing highly efficient output levels.

However, retaining highly efficient output levels throughout a broad frequency band is difficult with Doherty amplifiers, therefore, broadening the bandwidth of Doherty amplifiers has become an issue. The conventional techniques for broadening the bandwidth include, for example, configuring the output line of a peak amplifier to have the same characteristic impedance as the output line of a carrier amplifier and in the length corresponding to the half-wavelength of an operating frequency. There is also a technique of forming the output line of a peak amplifier by two types of lines.

However, these conventional techniques allow the impedance from a combining point on the peak amplifier side to grow over a broad frequency range, and the efficiency in a broadband cannot improve.

BRIEF DESCRIPTION OF THE DRAWINGS

FIG. 1 is a block diagram showing a Doherty amplifier according to a first embodiment.

FIG. 3 is a diagram showing an analysis model for a high-frequency circuit simulator.

FIG. 4 is a diagram showing an analysis result of the analysis model.

FIG. 5 is a circuit diagram showing a Doherty amplifier for use in analysis.

FIG. 6 is a diagram showing an analysis result of the characteristic impedance ratios between partial lines.

FIG. 9 is a diagram showing a third specific example of the Doherty amplifier.

FIG. 10 is a block diagram showing a Doherty amplifier according to a second embodiment.

FIG. 12 is a diagram showing a second specific example of the Doherty amplifier according to the second embodiment.

DETAILED DESCRIPTION

Figure 2:
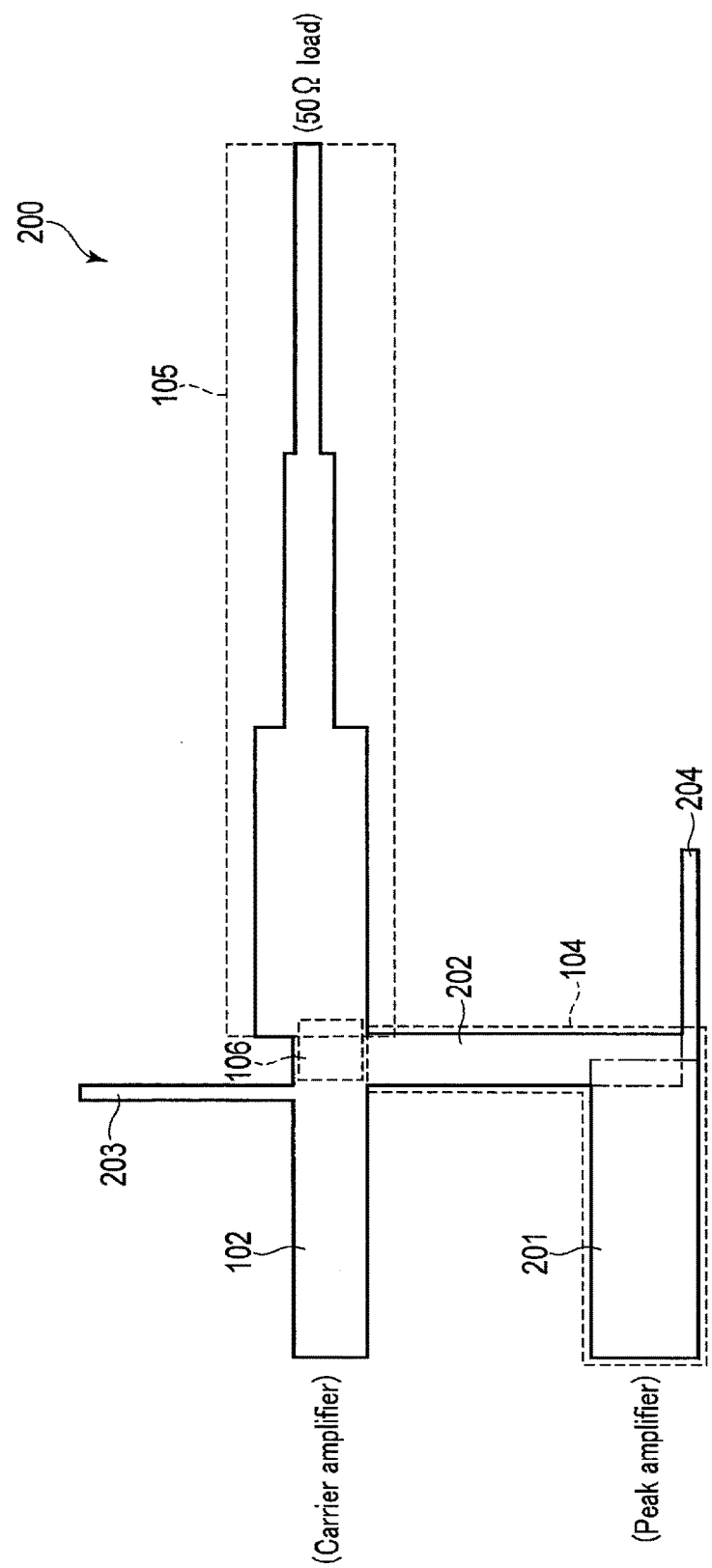
FIG. 2 is a diagram showing a first specific example of the Doherty amplifier.

Hereinafter, Doherty amplifiers according to a certain embodiment of the disclosures will be described in detail with reference to the drawings. Note that the following embodiments will assume that the portions with the same reference symbols operate in a similar manner, and redundant descriptions will be omitted.

According an embodiment, a Doherty amplifier includes a carrier amplifier, a peak amplifier, a first line and a second line. The carrier amplifier amplifies a signal and outputs a first output signal. The peak amplifier amplifies the signal and outputs a second output signal. The first line is connected to the carrier amplifier. The second line includes a first end connected to the peak amplifier and a second end connected to the first line. A characteristic impedance of the first end is lower than a characteristic impedance of the second end.

(First Embodiment)

A Doherty amplifier according to a first embodiment will be described with reference to the block diagram of FIG. 1.

A Doherty amplifier 100 according to the first embodiment comprises a carrier amplifier 101, a first line 102, a peak amplifier 103, a second line 104, and an impedance conversion line 105.

The carrier amplifier 101 receives an externally input signal, amplifies the input signal, and outputs the amplified input signal as a first output signal.

The first line 102 is, for example, a general high-frequency line (distribution constant line) such as a microstrip line. One end of the first line 102 is connected to the carrier amplifier 101 and the other end is connected to the impedance conversion line 105 which will be described later. The first line 102 transmits the first output signal from the carrier amplifier 101. Note that this embodiment forms the line to have a characteristic impedance lower than 50Ω for connection to the carrier amplifier, but the characteristic impedance may be changed according to a device to be connected.

The peak amplifier 103 amplifies the input signal when the signal level of the input signal approaches the saturation output power of the carrier amplifier 101, in other words, when the signal level of the input signal is larger than a threshold. The peak amplifier 103 outputs the amplified input signal as a second output signal. Note that operations of the carrier amplifier 101 and the peak amplifier 103, and at what signal level the operation of the peak amplifier 103 is triggered, are dependent on the operation of a general Doherty amplifier and the design parameters of a device that uses the Doherty amplifier 100 according to the first embodiment, thus their descriptions will be omitted from this embodiment.

The second line 104 is a general high-frequency line (distribution constant line) as the first line 102. One end (first end) of the second line 104 is connected to the peak amplifier 103 and the other end (second end) is connected to the first line 102. The second line 104 transmits the second output signal from the peak amplifier 103. Note that the first output signal from the carrier amplifier 101 and the second output signal from the peak amplifier 103 are combined at a point of connection between the first line 102 and the second line 104. As such, the point of connection between the first line 102 and the second line 104 will also be referred to as a combining point 106. The combining point is preferably set at a position apart from the output end of the carrier amplifier by approximately the quarter-wavelength of an operating frequency.

Also, the second line 104 is designed so that the characteristic impedance on the side of the peak amplifier 103 is lower than the characteristic impedance on the side of the combining point 106. As a method to change the line characteristic impedance, a general method of, for example, changing a line width, a substrate thickness, and a substrate relative permittivity may be adopted. Specifically, if reducing the characteristic impedance is desired, the line width can be increased, or the thickness of the substrate on which the line is formed can be reduced, or the relative permittivity of the substrate on which the line is formed can be increased.

The impedance conversion line 105 receives the signals from the first line 102 and the second line 104, which have been combined at the combining point, and converts the impedance for impedance matching with a device at the subsequent stage. This embodiment assumes the conversion to yield a value of 50Ω as the converted impedance, but the value of the converted impedance may be appropriately changed according to the device at the subsequent stage.

Next, a first specific example of the Doherty amplifier 100 will be described with reference to FIG. 2.

FIG. 2 is a Doherty amplifier 200 in which the first line 102, the second line 104, and the impedance conversion line 105 are formed by microstrip lines. Note that a substrate, the carrier amplifier 101, and the peak amplifier 103 are not shown here for the sake of explanation.

According to the first embodiment, the second line 104 is formed by two partial lines 201 and 202 which are different in characteristic impedance. Here, the electrical length of each of the partial line 201 and the partial line 202 is designed to be an equal division of approximately the half-wavelength of an operating frequency, in other words, the length is a bisection corresponding to approximately the quarter-wavelength (i.e., a phase length Φ=90°) of the operating frequency. Further, the characteristic impedance of the partial line 201 that is present on the peak amplifier 103 side is designed to be lower than the characteristic impedance of the partial line 202 that is present on the combining point 106 side. Note that FIG. 2 assumes that the substrate thickness and the substrate permittivity are constant, and shows an example where the characteristic impedance is adjusted by changing the line widths. That is, the width of the partial line 201 is larger than the width of the partial line 202.

Also, a drain voltage of the carrier amplifier 101 is supplied from the combining point 106 via a drain bias line 203 which is a microstrip line formed for power supply. A drain voltage of the peak amplifier 103 is supplied from a position separated from the output end of the peak amplifier 103 by approximately the quarter-wavelength of an operating frequency, i.e., the middle point between the partial line 201 and the partial line 202 in the first embodiment, via a drain bias line 204 formed in a similar manner to the drain bias line 203. In this way, the supply of power from the combining point 106 constitutes a quarter-wavelength distance from the output end of the carrier amplifier 101, and the supply of power from the middle point between the partial line 201 and the partial line 202 constitutes a quarter-wavelength distance from the output end of the peak amplifier 103. Accordingly, the combining point 106 and the middle point are both at a position of low impedance, and the influence of the bias circuit of each of the carrier amplifier 101 and the peak amplifier 103 can be reduced.

The impedance conversion line 105 uses a three-staged configuration for gradually approximating the characteristic impedance to 50Ω, but this is not a limitation and the impedance conversion line 105 may comprise two stages, one tapered-shape stage, or four or more stages.

Next, the relationship between the partial line 201 and the partial line 202 in electrical length will be described with reference to FIG. 3 and FIG. 4.

FIG. 3 is an analysis model 300 for a high-frequency circuit simulator, with a circuit analysis model assuming the peak amplifier 103 to be open. Note that the characteristic impedance of each line model is a standardized value.

Specifically, with the respective electrical lengths of the partial line 201 and the partial line 202 changed, analysis is conducted for reactance $|x\_f_{low}|$ at the minimum frequency and reactance $|x\_f_{high}|$ at the maximum frequency while varying frequency parameters in a desired bandwidth. The sum of the electrical length L1 of the partial line 201 and the electrical length L2 of the partial line 202 is set to correspond to approximately the half-wavelength (phase length Φ=180°) of an operating frequency.

FIG. 4 shows an analysis result of the analysis model 300 of FIG. 3.

In FIG. 4, a Table 400 associates the electrical length (L1) 401 of the partial line 201, the electrical length (L2) 402 of the partial line 202, the reactance ($|x\_f_{low}|$) 403 at the minimum frequency, the reactance ($|x\_f_{high}|$) 404 at the maximum frequency, and the minimum reactance ($|x|min$) 405 in the bandwidth with one another.

As shown by FIG. 4, the case of setting each of the electrical length (L1) 401 of the partial line 201 and the electrical length (L2) 402 of the partial line 202 to be the quarter-wavelength (phase length Φ=90°) of the operating frequency exhibits the highest minimum reactance value while creating a small variation in reactance at the minimum frequency and the maximum frequency. Therefore, where the second line 104 is formed by two stage partial lines, the electrical length of each partial line should preferably be the quarter-wavelength of an operating frequency.

Next, ratios in characteristic impedance between the partial line 201 and the partial line 202 will be described with reference to FIG. 5 and FIG. 6.

FIG. 5 is a circuit diagram 500 of the Doherty amplifier 100 for use in analysis. Efficiency and a saturation output power (Psat) are analyzed with the characteristic impedance Z1 of the partial line 201 standardized and fixed to "1", while increasing the characteristic impedance Z2 of the partial line 202 from "1.2" as a standardized value. Note that, as the analysis technique, the efficiency and the saturation output power are analyzed by harmonic balance analysis.

FIG. 6 shows an analysis result of the ratios in characteristic impedance for the circuit diagram 500 of FIG. 5.

In FIG. 6, a table 600 associates the results of assessment 603 as to whether or not the efficiency and the saturation output power are equal to or higher than desired values with each group of the standardized characteristic impedance (Z1) 601 and the standardized characteristic impedance (Z2) 602.

As shown by table 600, it can be understood that the efficiency and the saturation output power satisfy the desired values under the conditions that the standardized characteristic impedance (Z2) 602 is from "1.2" to "3.2" with respect to the standardized characteristic impedance (Z1) 601. Therefore, the ratio in characteristic impedance should desirably satisfy the relationship, where the characteristic impedance Z2 is larger than the characteristic impedance Z1 and equal to or less than approximately three times the characteristic impedance Z1.

Next, a simulation result of the Doherty amplifier 100 according to the first embodiment will be described with reference to FIG. 7.

Figure 7:
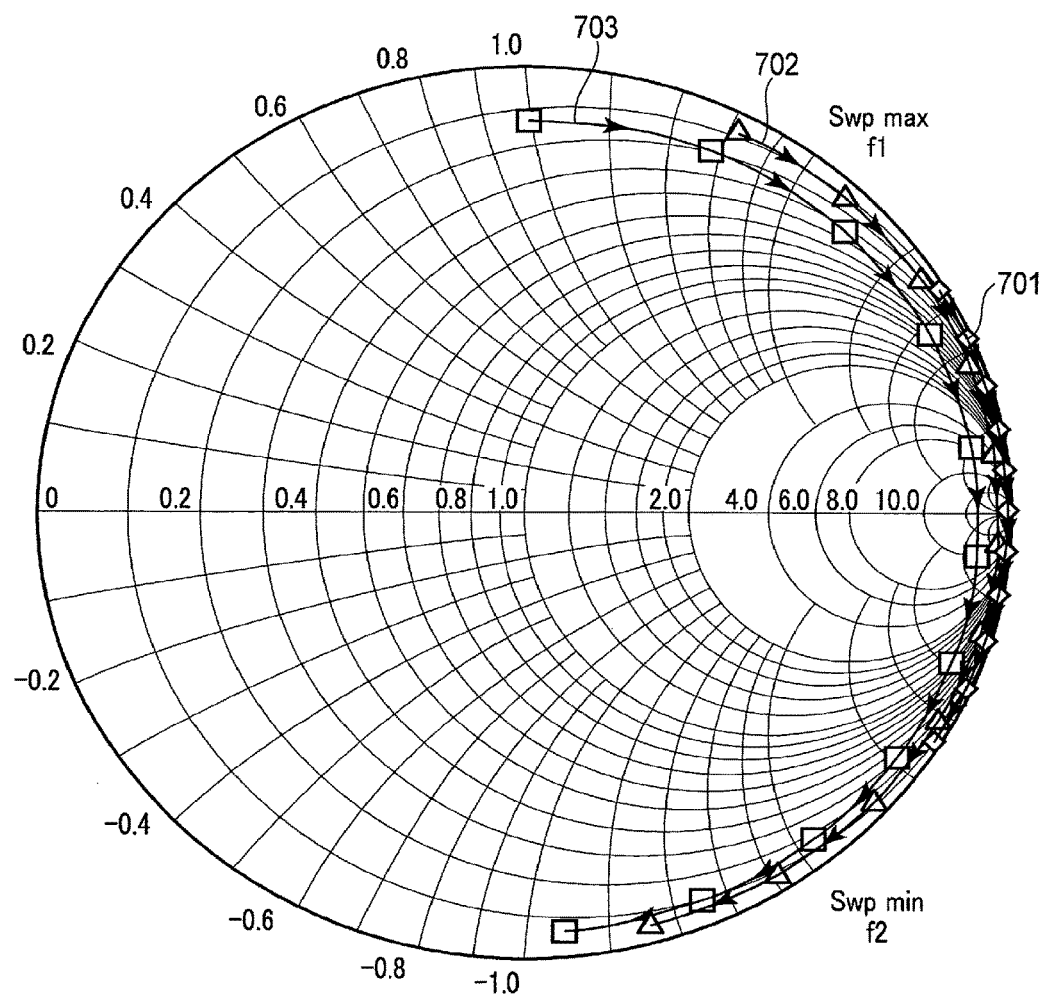
FIG. 7 is a diagram showing a simulation result of the Doherty amplifier according to the first embodiment.

FIG. 7 is a result of adopting the circuit diagram 500 of the Doherty amplifier 100 of FIG. 5 as an equivalent circuit and, for the equivalent circuit, analyzing the impedance on the peak amplifier 103 side from the combining point 106 using a high-frequency simulator. As the analysis result, impedances obtained by varying the parameter of the operating frequency from a first frequency $f_1$ to a second frequency $f_2$ are shown. The analysis result of the Doherty amplifier 100 according to the first embodiment is shown as a graph 701. For comparison, analysis results conducted under the same conditions for the conventional Doherty amplifiers as well are shown as a graph 702 and a graph 703.

As shown by FIG. 7, the impedance of the graph 701 hardly changes through the band from the first frequency f1 to the second frequency f2, and it can be understood that the impedance growth over frequencies has been suppressed as compared to the graph 702 and the graph 703.

Next, a second specific example of the Doherty amplifier 100 will be described with reference to FIG. 8.

Figure 8:
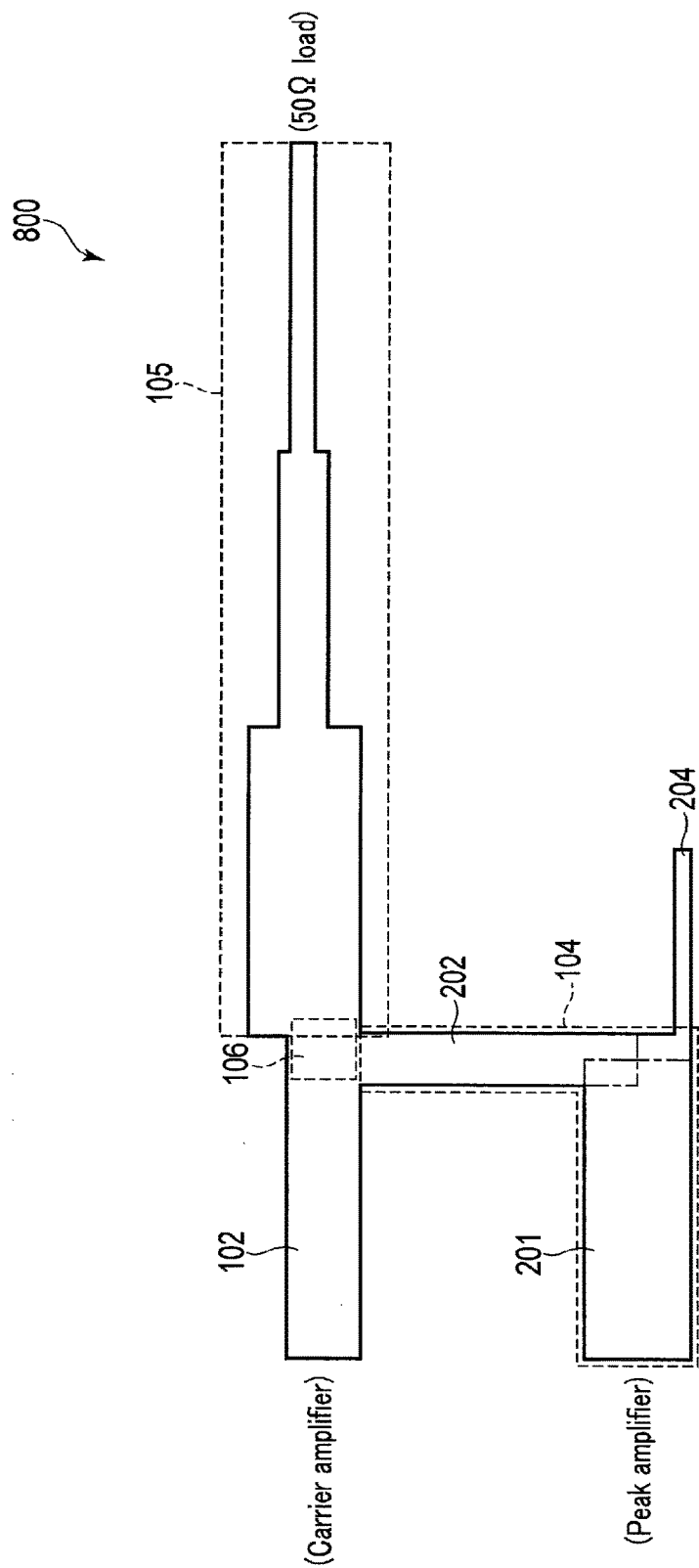
FIG. 8 is a diagram showing a second specific example of the Doherty amplifier.

A Doherty amplifier 800 shown in FIG. 8 is a Doherty amplifier in which the first line 102, the second line 104, and the impedance conversion line 105 are formed by microstrip lines as in FIG. 2, but differs in supply method. Specifically, at least one of the drain voltage of the carrier amplifier 101 and the drain voltage of the peak amplifier 103 is supplied from the middle point between the partial line 201 and the partial line 202 via the drain bias line 204. Note that the drain voltage of the amplifier on the side, where the drain bias line 204 does not supply the power, may be supplied by another method.

Next, a third specific example of the Doherty amplifier 100 will be described with reference to FIG. 9.

A Doherty amplifier 900 shown in FIG. 9 is similar to FIG. 2 and FIG. 8, but at least one of the drain voltage of the carrier amplifier 101 and the drain voltage of the peak amplifier 103 is supplied from the combining point 106 via the drain bias line 203. Note that the drain voltage of the amplifier on the side, where the drain bias line 203 does not supply the power, may be supplied by another method.

By also using the supply methods shown by FIG. 8 and FIG. 9, the influence of the bias circuit of each of the carrier amplifier 101 and the peak amplifier 103 can be reduced.

According to the first embodiment set forth above, growth of the characteristic impedance over frequencies can be suppressed by designing the line connected to a peak amplifier so that the characteristic impedance on the peak amplifier side is lower than the characteristic impedance on the combining point side. Therefore, degradation of efficiency due to the influence by the output end of the peak amplifier can be suppressed even with the output power which is backed off from a saturation output power, and a Doherty amplifier capable of providing highly efficient outputs in a broadband can be realized.

(Second Embodiment)

A difference from the first embodiment, which forms the second line by two stages, is forming the second line by three or more stages.

Descriptions will be made for a block diagram of a Doherty amplifier according to a second embodiment, with reference to FIG. 10.

FIG. 10 is block diagram which indicates a Doherty amplifier 1000 according to the second embodiment as an equivalent circuit, including a carrier amplifier 101, a first line 102, a peak amplifier 103, a second line 1001, and an impedance conversion line 105. Operations of the carrier amplifier 101, the first line 102, the peak amplifier 103, and the impedance conversion line 105, as well as the methods of supply from a drain bias line 203 and a drain bias line 204 are the same as the first embodiment; thus, their descriptions will be omitted here.

The second line 1001 is formed by three partial lines 1002, 1003, and 1004 which are different in characteristic impedance. Here, the electrical length of each of the partial line 1002, the partial line 1003, and the partial line 1004 is preferably an equal division of approximately the half-wavelength of an operating frequency, and being a tri-section, is a length corresponding to approximately the sixth-wavelength (phase length $\Phi=60°$) of the operating frequency.

Also, the characteristic impedance of the partial line 1002 is designed to be lower than the characteristic impedance of each of the partial line 1003 and the partial line 1004, and the characteristic impedance of the partial line 1003 is designed to be lower than the characteristic impedance of the partial line 1004. That is, the multiple partial lines are designed so that, on the second line 104, the characteristic impedance of the partial line present on the peak amplifier 103 side is lower than the characteristic impedance of the partial line present on the combining point 106 side. In other words, the characteristic impedances may be designed to decrease by each partial line from the combining point 106 side toward the peak amplifier 103 side. With such a design, growth of the characteristic impedance over frequencies can be suppressed as in the first embodiment. Note that the second embodiment shows an example where the second line 1001 is formed by three stages, but this is not a limitation. Even in the instances of forming the second line 1001 by a greater number of stages, the characteristic impedances may be designed to decrease by each partial line from the combining point 106 side toward the peak amplifier 103 side. When the number of stages is further increased so that a one-stage tapered shape may be assumed, a similar design may be adopted, too.

A first specific example of the Doherty amplifier 1000 according to the second embodiment will be described with reference to FIG. 11.

Figure 11:
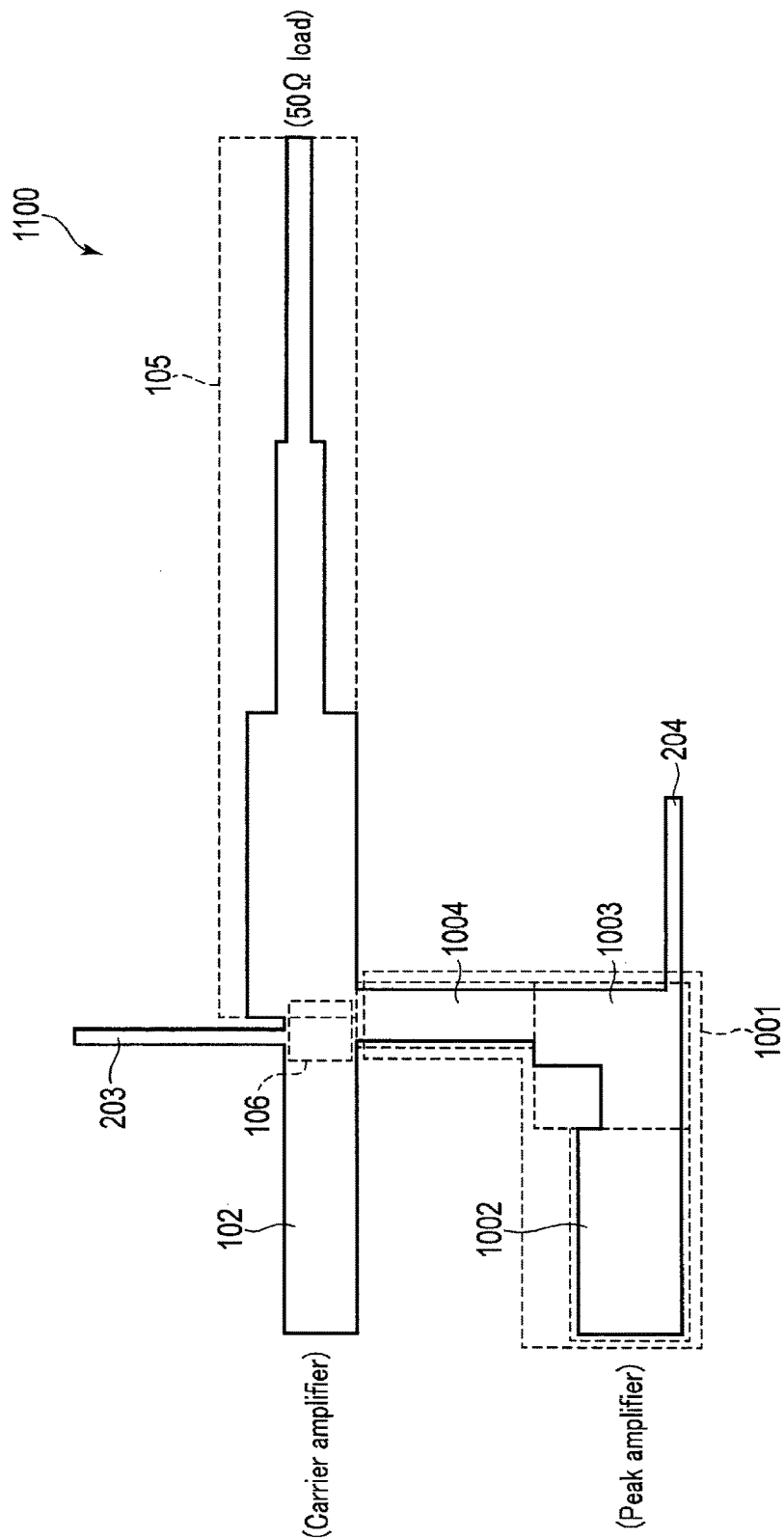
FIG. 11 is a diagram showing a first specific example of the Doherty amplifier according to the second embodiment.

In a Doherty amplifier 1100 shown by FIG. 11, the first line 102, the second line 1001, the impedance conversion line 105, the drain bias line 203, and the drain bias line 204 are formed by microstrip lines.

The drain voltage of the carrier amplifier 101 is supplied from the combining point 106 via the drain bias line 203, and the drain voltage of the peak amplifier 103 is supplied from the partial line 1003 via the drain bias line 204.

Next, a second specific example of the Doherty amplifier 1000 according to the second embodiment will be described with reference to FIG. 12.

A Doherty amplifier 1200 shown by FIG. 12 has substantially the same configuration as the Doherty amplifier 1100 shown by FIG. 11 but differs from the first specific example in that at least one of the drain voltage of the carrier amplifier 101 and the drain voltage of the peak amplifier 103, as in FIG. 8, is supplied from a position separated from the output end of the peak amplifier 103 by approximately the quarter-wavelength of an operating frequency, here the partial line 1003, via the drain bias line 204. Such a form can also provide the same effect as the first specific example.

According to the second embodiment set forth above, growth of the characteristic impedance over frequencies can be suppressed as in the first embodiment by designing the second line connected to a peak amplifier so that the characteristic impedance on the peak amplifier side is lower than the characteristic impedance on the combining point side even when the second line is formed by three or more stages. That is, broadening the bandwidth of Doherty amplifiers and enhancing the efficiency of the same can be realized.

Note that in the Doherty amplifier 100 described above, the saturation output power of the peak amplifier 103 may be designed to be larger than the saturation output power of the carrier amplifier 101. With such a design, the carrier amplifier 101 starts to saturate at the back-off point of 6 dB or greater, and therefore the efficiency in output power can be improved even if a 6 dB or greater back-off occurs, and a higher efficiency than general Doherty amplifiers can be achieved.

Additionally, a capacitor may be connected between the combining point 106 and a ground. With the connection of a capacitor, the impedance of harmonic components can be optimized and the high-frequency characteristics can be improved over a broadband.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A Doherty amplifier comprising:
   a carrier amplifier which amplifies a signal and outputs a first output signal;
   a peak amplifier which amplifies the signal and outputs a second output signal;
   a first line connected to the carrier amplifier; and
   a second line comprising a first end connected to the peak amplifier and a second end connected to the first line, wherein a characteristic impedance of the first end is lower than a characteristic impedance of the second end, wherein the second line is formed by three or more partial lines,
   on the second line, a characteristic impedance of the partial line that is present on a side of the first end is lower than a characteristic impedance of the partial line that is present on a side of the second end,
   an electrical length of each of the partial lines is an equal division of approximately a half-wavelength of an operating frequency, and
   at least one of a drain voltage of the carrier amplifier and a drain voltage of the peak amplifier is supplied from a position apart from an output end of the peak amplifier by approximately a quarter-wavelength of an operating frequency.

2. The Doherty amplifier according to claim 1, wherein a saturation output power of the peak amplifier is larger than a saturation output power of the carrier amplifier.

3. The Doherty amplifier according to claim 1, wherein one of the drain voltage of the carrier amplifier and the drain voltage of the peak amplifier is supplied from a point at which the second end is connected to the first line.

4. The Doherty amplifier according to claim 1, wherein both of the drain voltage of the carrier amplifier and the drain voltage of the peak amplifier are supplied from the position apart from the output end of the peak amplifier by approximately the quarter-wavelength of the operating frequency.

5. The Doherty amplifier according to claim 1, wherein the drain voltage of the carrier amplifier is supplied from a point at which the second end is connected to the first line.

6. The Doherty amplifier according to claim 1, wherein a line width of the first end is larger than a line width of the second end.

7. The Doherty amplifier according to claim 1, wherein a thickness of a substrate on which the first end is formed is smaller than a thickness of a substrate on which the second end is formed.

8. The Doherty amplifier according to claim 1, wherein a relative permittivity of a substrate on which the first end is formed is higher than a relative permittivity of a substrate on which the second end is formed.

9. The Doherty amplifier according to claim 1, wherein the second line has a lower characteristic impedance at a portion closer to the first end.

* * * * *